US006924701B1

(12) United States Patent
Bhandari

(10) Patent No.: US 6,924,701 B1
(45) Date of Patent: Aug. 2, 2005

(54) METHOD AND APPARATUS FOR COMPENSATING AN AMPLIFIER

(75) Inventor: Sanjay M. Bhandari, San Jose, CA (US)

(73) Assignee: Ikanos Communications, Inc., Fremont, CA (US)

( * ) Notice: Subject to any disclaimer, the term of this patent is extended or adjusted under 35 U.S.C. 154(b) by 0 days.

(21) Appl. No.: 10/453,571

(22) Filed: Jun. 3, 2003

Related U.S. Application Data

(60) Provisional application No. 60/408,060, filed on Sep. 3, 2002.

(51) Int. Cl.[7] ................................ H03F 3/45
(52) U.S. Cl. ........................ 330/252; 330/261
(58) Field of Search ............... 330/252, 253, 330/254, 261; 327/359

(56) References Cited

U.S. PATENT DOCUMENTS

| 4,284,959 | A |   | 8/1981 | Heagerty et al. |
|---|---|---|---|---|
| 4,577,162 | A | * | 3/1986 | Peterson ............... 330/253 |
| 5,406,220 | A |   | 4/1995 | Jones et al. |
| 6,177,838 | B1 |  | 1/2001 | Chiu |
| 6,300,831 | B1 |  | 10/2001 | Xi |
| 6,388,521 | B1 |  | 5/2002 | Henry |
| 6,392,490 | B1 |  | 5/2002 | Gramegna et al. |
| 6,469,579 | B2 |  | 10/2002 | Bazes |
| 6,741,129 | B1 | * | 5/2004 | Corsi et al. ........... 330/252 |

FOREIGN PATENT DOCUMENTS

| EP | 0 824 783 B1 | 4/2002 |
|---|---|---|
| EP | 1 081 573 B1 | 9/2003 |

* cited by examiner

Primary Examiner—Henry Choe
(74) Attorney, Agent, or Firm—IP Creators; Charles C. Cary

(57) ABSTRACT

A method and apparatus for compensating an amplifier is disclosed which significantly improves the unity gain bandwidth of the amplifier. In an embodiment of the invention the amplifier includes at least one compensated pair of cascode coupled transistors including: an input transistor, a cascode transistor, and a bypass element. The input transistor exhibits a first transition frequency. The cascode transistor is cascode coupled to the input transistor. The cascode transistor exhibits a second transition frequency less than or equal to the first transition frequency of the input transistor. The bypass element couples across a corresponding current interface of the cascode transistor to substantially bypass the cascode transistor at a pole frequency thereof.

22 Claims, 7 Drawing Sheets

Folded Cascode Type Differential Amplifier Stage with Bypass Compensation

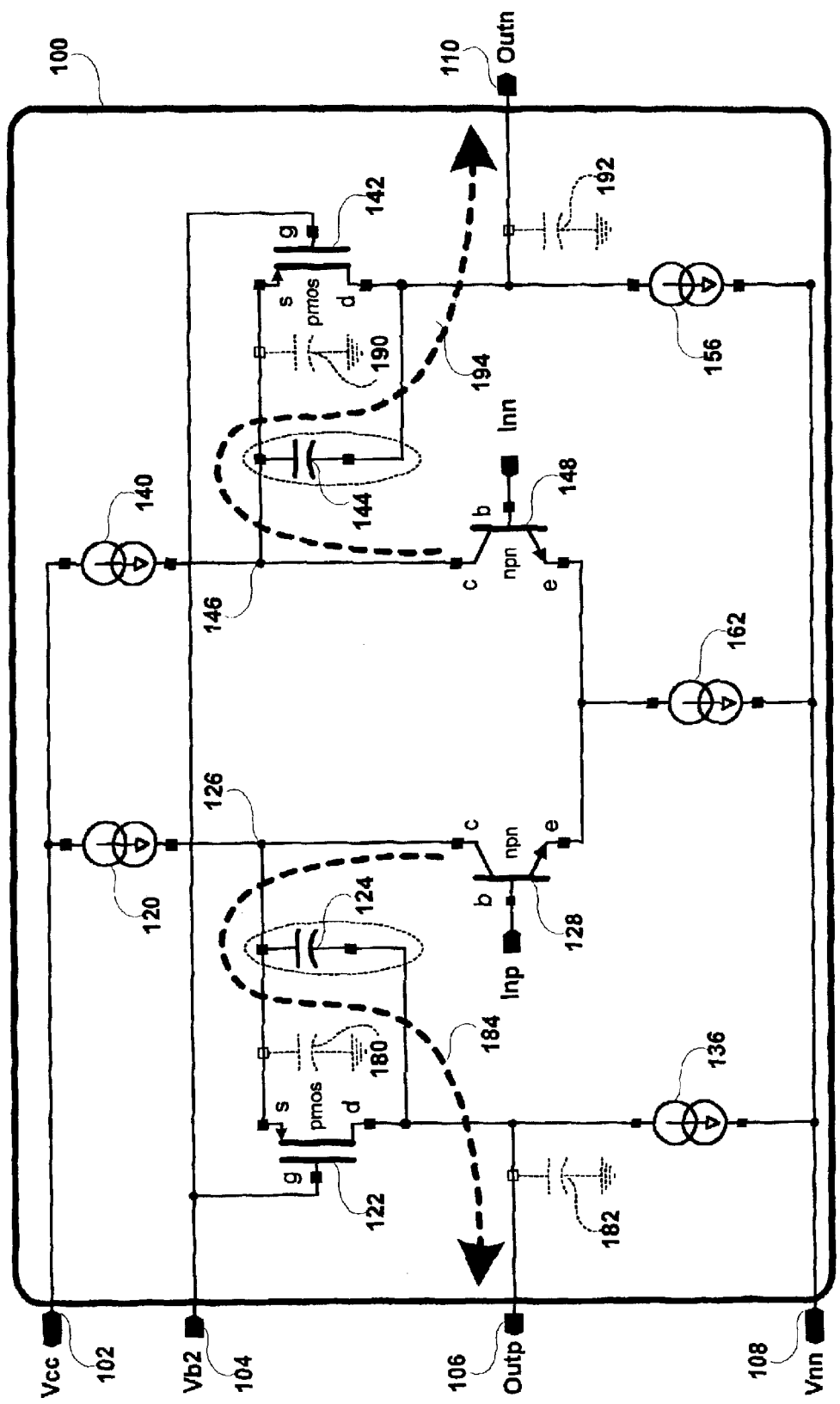
FIG. 1A  Folded Cascode Type Differential Amplifier Stage with Bypass Compensation

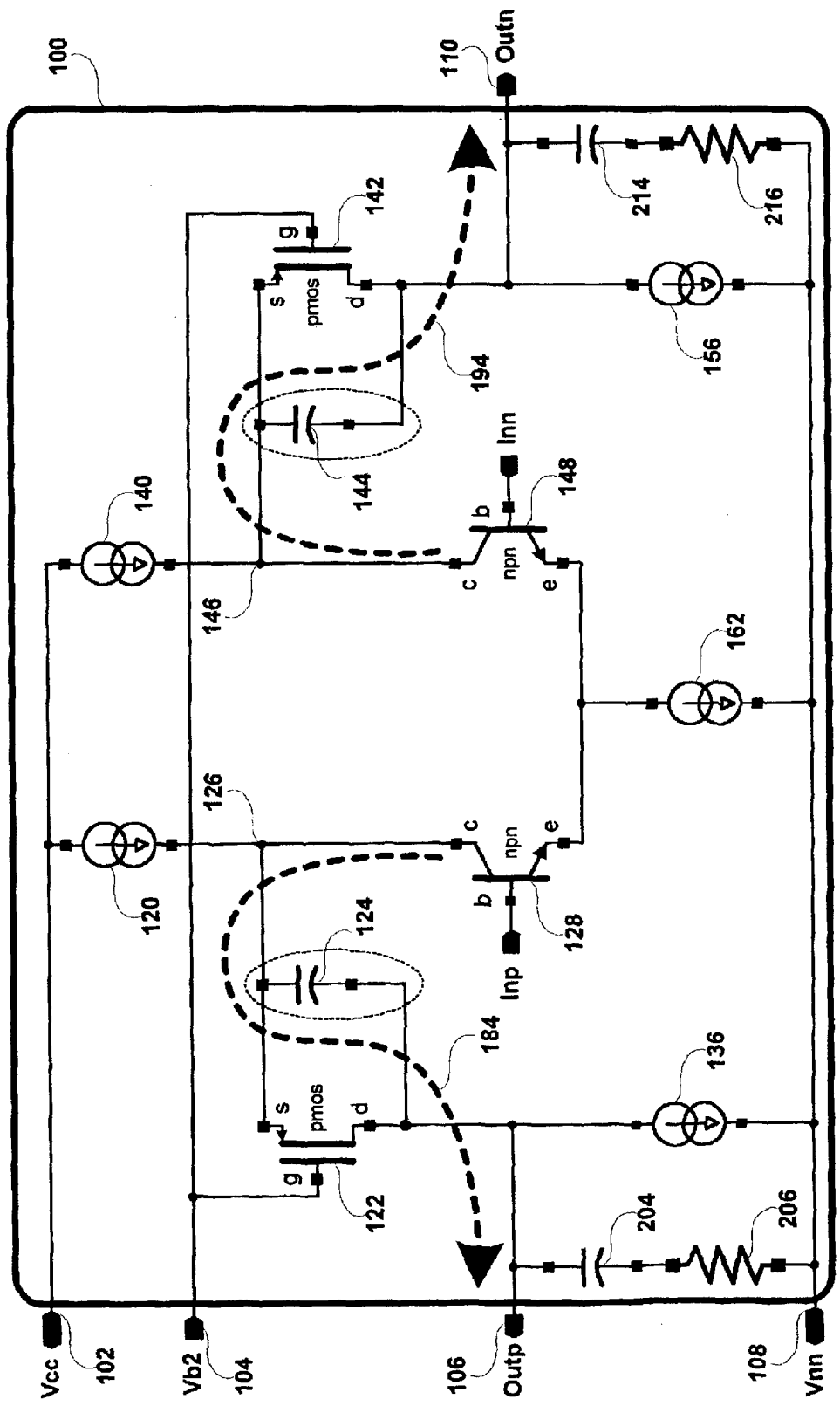
FIG. 1B Folded Cascode Type Differential Amplifier Stage with Compensation Telescopic Type Cascode Differential
Amplifier Stage with Compensation Telescopic Type Cascode Differential
Amplifier Stage with Compensation Folded Cascode Type Differential Amplifier First Stage with Compensation

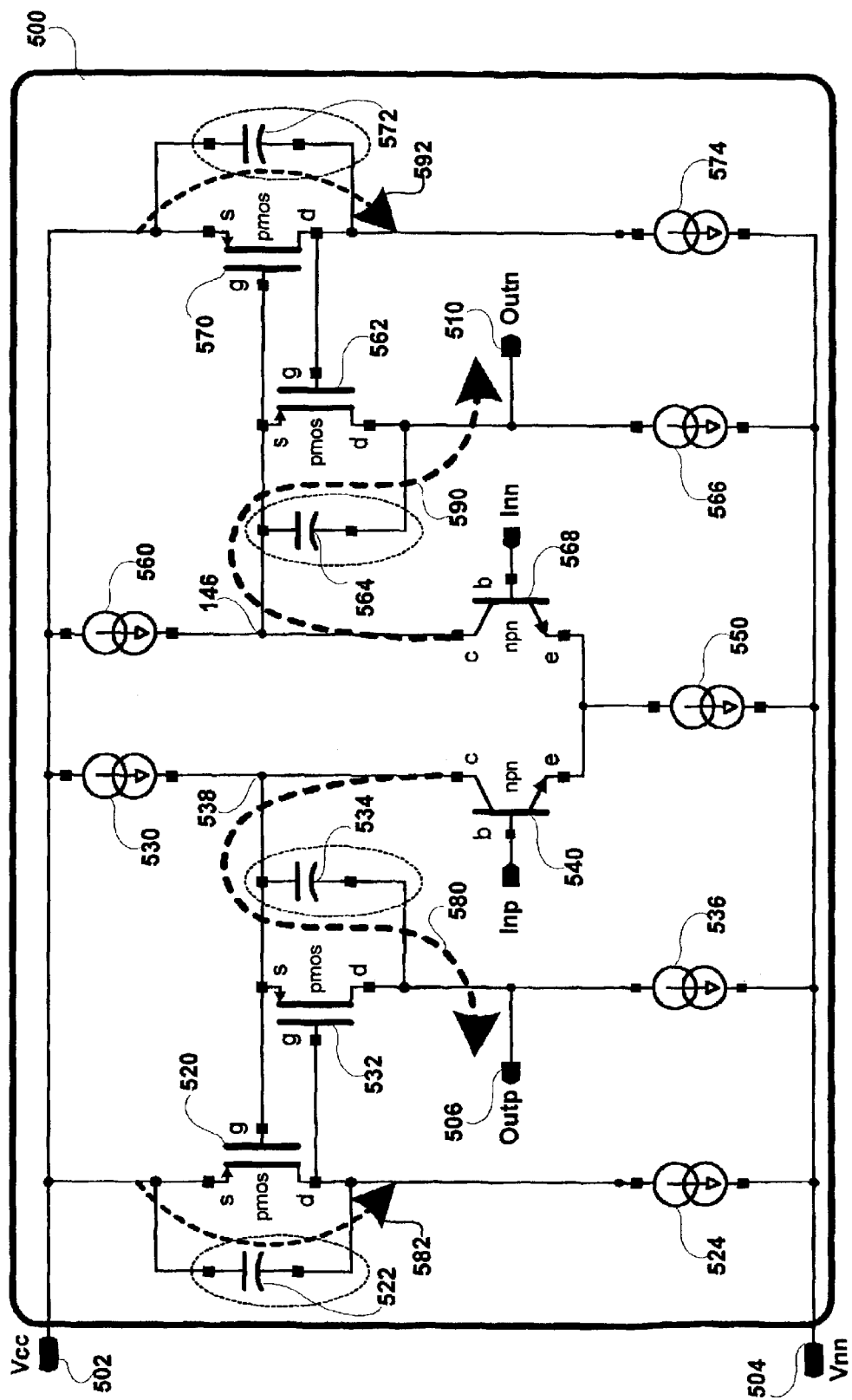
FIG. 5 Gain Boosted Folded Cascode Type Differential Amplifier Stage with Compensation

US 6,924,701 B1

METHOD AND APPARATUS FOR COMPENSATING AN AMPLIFIER

CROSS REFERENCE TO RELATED APPLICATION

This application claims the benefit of prior filed Provisional Application No. 60/408,060 filed on Sep. 3, 2002, now abandoned, entitled "Amplifier compensation architecture to design high unity gain bandwidth amplifiers" which is incorporated herein by reference in its entirety as if fully set forth herein.

BACKGROUND OF THE INVENTION

1. Field of Invention

The present invention is generally related to amplifier circuits, and more particularly to cascode type amplifiers.

2. Description of the Related Art

Amplifiers are typically fabricated on integrated circuits for a wide variety of electronic applications including the amplification of analog signals. A class of such amplifiers, identified as cascode amplifiers is ideally suited to integrated circuits due to their high gain. Cascode amplifiers conventionally comprise two transistors the main conductions paths of which are either serially coupled so that both the input transistor and cascode transistor carry the same quiescent current in which case the amplifier is said to have a telescopic cascode design or parallel coupled so that the quiescent currents of input transistor and cascode can be independently controlled in which case the amplifier is said to have a folded cascode design. Either design may be implemented with a single ended or differential input.

In high frequency applications and in particular high frequency applications requiring multiple stages of amplification; the performance of these amplifiers is degraded by parasitic and other capacitances in each stage, the cumulative effect of which is to increase settling time and decrease the stability of the amplifier. What is needed is a method and apparatus for improving the high frequency performance of cascode amplifier designs.

SUMMARY OF THE INVENTION

A method and apparatus for compensating an amplifier is disclosed which significantly improves the unity gain bandwidth (UGBW) of the amplifier. The compensation may be implemented in amplifier types including: folded cascode, telescopic cascode and gain boosted cascode configurations. This amplifier may be implemented in a range of process architectures including: complementary metal oxide semiconductor (CMOS) and bipolar CMOS (BiCMOS). The amplifier may be implemented with: bipolar junction transistors (BJT) or field effect transistors (FET).

In an embodiment of the invention an amplifier is disclosed. The amplifier includes at least one compensated pair of cascode coupled transistors including: an input transistor, a cascode transistor, and a bypass element. The input transistor exhibits a first transition frequency. The cascode transistor is cascode coupled to the input transistor. The cascode transistor exhibits a second transition frequency less than or equal to the first transition frequency of the input transistor. The bypass element couples across a corresponding current interface of the cascode transistor to substantially bypass the cascode transistor proximate a pole frequency thereof.

In an alternate embodiment of the invention a method for amplifying input signals having frequencies spanning a range of frequencies is disclosed. The method comprises:

cascode coupling between at least one current source and sink, at least one input transistor exhibiting a first transition frequency and at least one cascode transistor exhibiting a second transition frequency less than or equal to the first transition frequency;

coupling a control interface of the at least one input transistor to the input signals to regulate current flow between the at least one current source and sink; and passing current between the at least one current source and sink via both the input transistor together with the cascode transistor across a low frequency portion of the range of frequencies below a pole frequency associated the at least one cascode transistor and via the input transistor and a bypass of the at least one cascode transistor across a high frequency portion of the range of frequencies above the pole frequency of the at least one cascode transistor.

In an alternate embodiment of the invention a means for amplifying is also disclosed.

BRIEF DESCRIPTION OF THE DRAWINGS

These and other features and advantages of the present invention will become more apparent to those skilled in the art from the following detailed description in conjunction with the appended drawings in which:

FIGS. 1A–B are circuit diagrams of a folded cascode differential amplifier stage with compensation according to alternate embodiments of the invention.

FIG. 5 is a circuit diagram of a gain boosted folded cascode type differential amplifier stages with compensation according to an embodiment of the invention.

DETAILED DESCRIPTION OF THE EMBODIMENTS

Figure 2A:
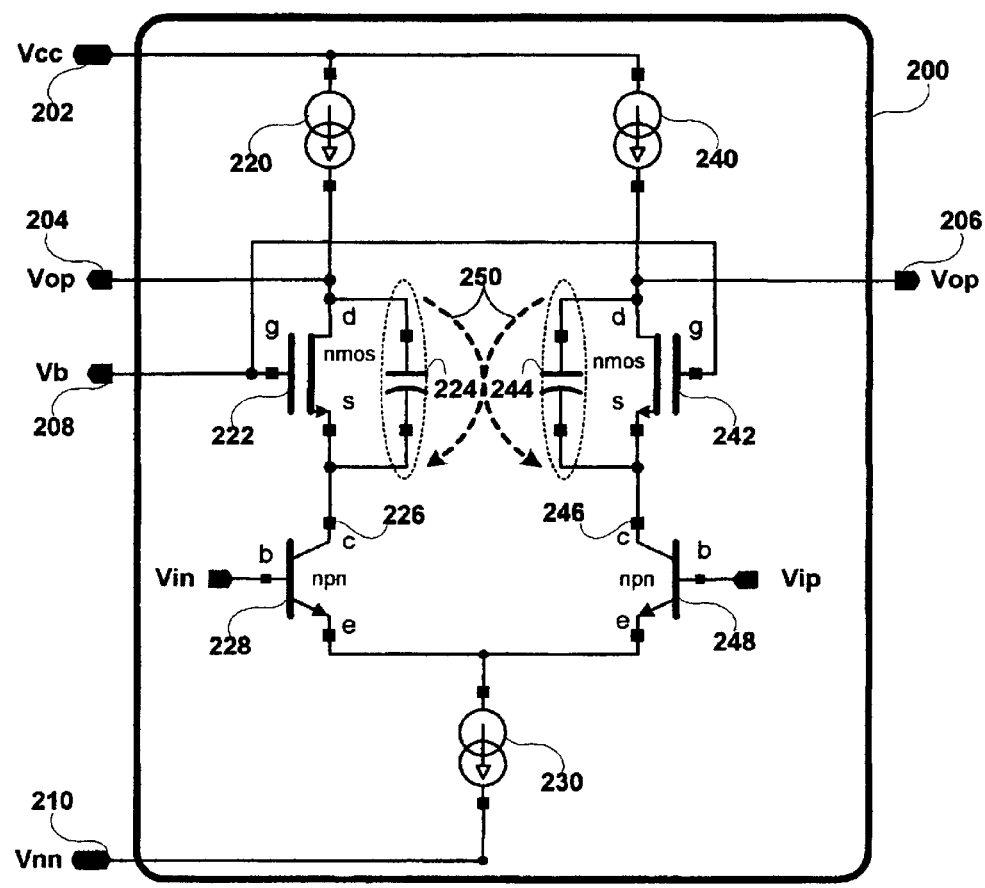
FIGS. 2A–B are circuit diagrams of a telescopic cascode type differential amplifier stages with compensation according to alternate embodiments of the invention.

FIG. 1A is a circuit diagram of a folded cascode differential amplifier stage 100 with compensation according to an embodiment of the invention. The circuit is implemented in this example with bipolar complementary metal oxide semiconductor (BiCMOS) process technology. This process technology is particularly suited for mixed mode, i.e. analog and digital, integrated circuits. The circuit includes two pairs of folded cascode coupled transistors 122,128 and 142,148 with the input transistors 128, 148 of each pair coupled to corresponding ones of the differential input signals $In_p$ and $In_n$. Each transistor has a control interface, e.g. the gate/base, and a current interface, e.g. the drain-source/collector-emitter, with the alternate designations reflecting the transistor type. The differential input signals $In_p$ and $In_n$ applied to the control interfaces of input transistors 128, 148 are converted into differential currents. The emitter portion of the current interfaces of both input transistors 128, 148 couple in parallel to a common current sink 162 which is in turn coupled to voltage Vnn at pad 108. The drain portion of the current interfaces of each cascode transistor 122, 142 couples to a corresponding one of current sinks 136, 156 respectively which are in turn coupled to the voltage Vnn at pad 108. The differential outputs are provided at pads 106, 110 which tap the corresponding connection between each cascode transistor 122, 142 and the corresponding current sink 136, 156 respectively. The control interfaces of the cascode transistors, i.e. the gates of FETs 122, 142 are coupled to a bias voltage Vb2 at pad 104. The source/collector portion of the current interface of each transistor in the two pairs of cascode coupled transistors, couples to a corresponding one of current sources 120, 140 which are in turn coupled to the voltage Vcc at pad 102. Bypass compensation capacitors 124 and 144 are coupled across the current interfaces, e.g. drain-source connection, on the corresponding cascode transistor 122, 142 respectively.

The input and cascode transistors of each pair are of complementary conductivity types, i.e. "n" type and "p" type with the higher speed of the two types, i.e. the "n" type selected for the input transistor. Additionally, where as here, the process technology is bipolar complementary metal oxide semiconductor (BiCMOS) the input transistor is implemented with the higher speed transistor type, i.e. bipolar junction transistor (BJT) while the cascode transistor is implemented with a lower frequency transistor type, e.g. field effect transistor (FET). The choice of the higher speed conductivity and/or transistor type for the input transistor maximizes the operational frequency range of the amplifier, about which more discussion will follow in FIG. 4.

Also shown in FIG. 1A are the parasitic capacitances. These are not physical components in the layout, rather a convenient way of modeling the behavior of the amplifier. The output capacitances 182, 192 which form the dominant pole of the amplifier are shown at the outputs 106, 110 respectively. The internal parasitic capacitances 180, 190 at nodes 126, 146 respectively together with the inverse of transconductance of the associated cascode transistor forms a non-dominant pole of the amplifier.

In operation the bypass capacitors 124, 144 are sized such that the differential currents flows generated by the input transistors flow through the folded cascode transistors 122, 142 at frequencies below the pole frequency of the corresponding cascode transistor. At these low frequencies, the capacitors 124, 144 have no effect, thereby preserving cascode gain. However the capacitors 124, 144 are sized to bypass the corresponding folded cascode transistor introducing a zero proximate to the frequency where the pole due to the folded cascode transistor comes into effect. The high frequency bypass is represented by the bypass current paths 184, 194 shown in dotted line. As a result, the non-dominant pole due to the folded cascode is eliminated, the output impedance is reduced, and differential current substantially bypasses the cascode transistors flowing instead directly to the outputs 106, 110 at frequencies above the pole frequency. Thus the beneficial effects of the folded cascode design at low frequencies, e.g. high gain, are retained and the detrimental effects of the folded cascode architecture at high frequencies, i.e. gain attenuation and reduced phase margin, are overcome by allowing the amplifier at these frequencies to perform as a effectively single pole amplifier.

FIG. 1B shows an alternate embodiment of the current invention in which the amplifier is compensated both at the folded cascode transistors as well as at the output. Output compensation is shown in the form of series coupled capacitor-resistor combinations 204–206 and 214–216 at outputs 106, 110 respectively. These increase the stability of the amplifier particularly in multi-stage designs. In alternate embodiments of the invention output compensation is provided by: a capacitor or a Miller gain stage. Neither of these output compensation techniques however provide the advantage of the folded cascode bypass, i.e. relatively small capacitor sizing and hence reduced power requirements.

In an alternate embodiment of the invention in which the folded cascode differential amplifier is implemented in CMOS technology, the input transistors will be NMOS transistors, which still have higher $f_T$ compared with PMOS cascode transistors.

FIG. 2A is a circuit diagram of telescopic cascode type differential amplifier stage 200 with bypass compensation according to an embodiment of the current invention. The circuit is implemented in this example with BiCMOS process technology. The circuit includes two pairs of telescopic cascode coupled transistors 222,228 and 242, 248 with the input transistors 228, 248 of each pair coupled to corresponding ones of the differential input signals $Vi_n$ and $Vi_p$ respectively. Each transistor has a corresponding control interface, e.g. the gate/base, and current interface, e.g. the drain-source/collector-emitter; with the alternate designations reflecting the transistor type. The differential input signals $Vi_n$ and $Vi_p$ applied to the control interfaces of input transistors 228, 248 are converted into differential currents. The emitter portion of the current interfaces of both input transistors 228, 248 couple in parallel to a common current sink 230 which is in turn coupled to voltage Vnn at pad 210. The source portion of the current interface of each telescopic cascode transistor 222, 242 couples to the collector of each corresponding input transistor 228, 248 respectively. The differential outputs are provided at pads 204, 206 which tap the drain side of the current interface of each corresponding telescopic cascode transistor 222, 242. The control interfaces of the telescopic cascode transistors, i.e. the gates of FETs 222, 242 are coupled to a bias voltage Vb at pad 208. The drain portion of the current interface of each telescopic cascode transistor 222, 242 couples to a corresponding one of current sources 220, 240 which are in turn coupled to the voltage Vcc at pad 202. Bypass compensation capacitors 224 and 244 are coupled across the current interfaces, e.g. drain-source connection on the corresponding cascode transistor 222, 242 respectively.

The input and cascode transistors of each pair are of similar high speed conductivity type, i.e. "n" type. Additionally, where as here, the process technology is BiCMOS the input transistor is implemented with the higher speed transistor type, i.e. BJT while the cascode transistor is implemented with a lower frequency transistor type, e.g. FET. The choice of the higher speed conductivity and/or transistor type for the input transistor maximizes the operational frequency range of the amplifier.

In operation the bypass capacitors 224, 244 are sized such that the differential currents flows generated by the input transistors flow through the telescopic cascode transistors 222, 242 at frequencies below the pole frequency of the corresponding cascode transistor together with the parasitic capacitances at nodes 226,246 respectively. At these low frequencies, the capacitors 224, 244 have no effect, thereby preserving cascode gain. However the capacitors 224, 244 are sized to bypass the corresponding cascode transistor introducing a zero before the pole due to the telescopic cascode transistor comes into effect. The high frequency bypass is represented by the bypass current paths 250 shown in dotted line. As a result, the non-dominant pole due to the telescopic cascode is eliminated, the output impedance is reduced, and differential current substantially bypasses the telescopic transistors flowing instead directly to the outputs 204, 206 at frequencies above the pole frequency of the corresponding telescopic cascode transistor. Thus the beneficial effects of the folded cascode design at low frequencies, e.g. high gain, are retained and the detrimental effects of the folded cascode architecture at high frequencies, i.e. gain attenuation and reduced phase margin, are overcome by allowing the amplifier at these frequencies to perform as a single pole amplifier.

Figure 2B:
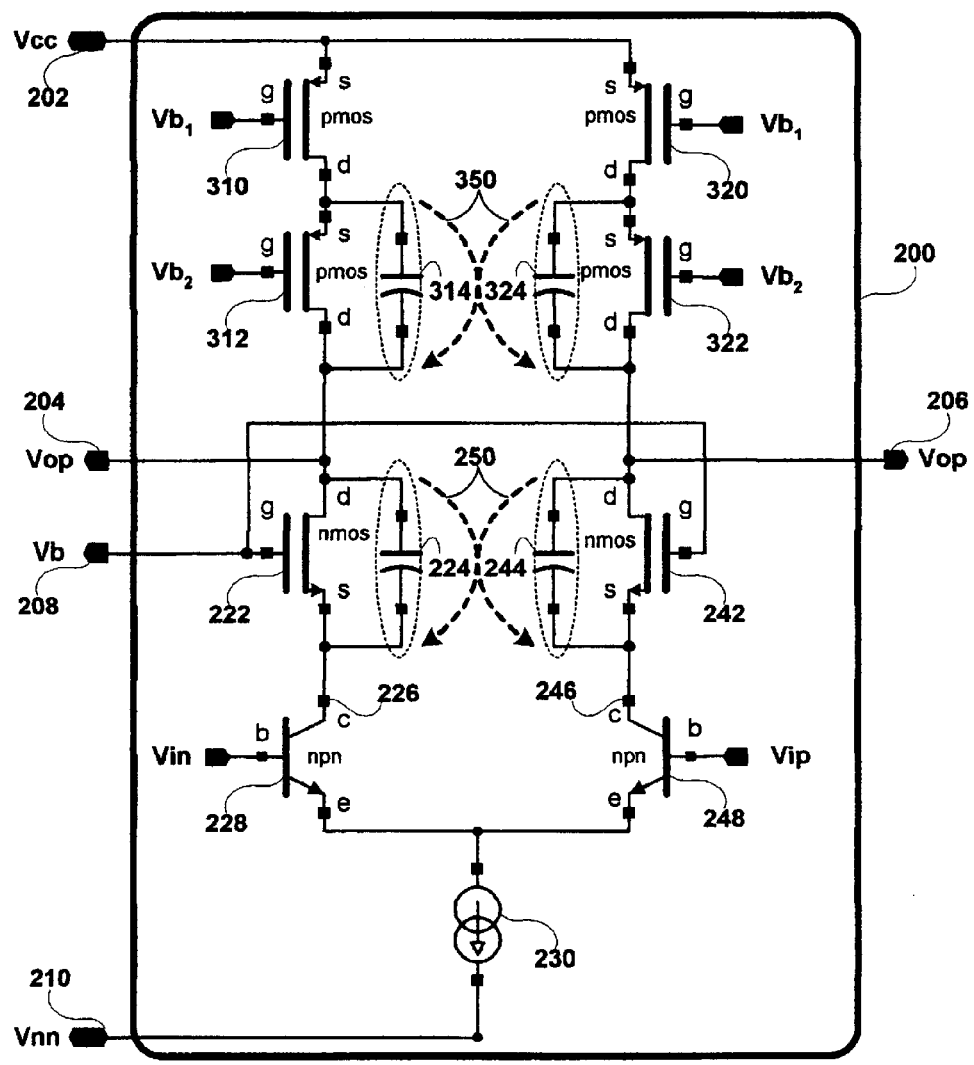

FIG. 2B shows an alternate embodiment of the current invention to that shown in FIG. 2A in which the amplifier is compensated both at the telescopic cascode transistors as well as in the current sources. The current sources are formed by a corresponding pair of PMOS type telescopic cascode coupled transistors 310–312 and 320–322 respectively. The current source transistors 310 and 320 of each current source are coupled at the source portion of the corresponding current interfaces to Vcc at pad 202. The control interfaces of the current source transistor 310, 320 are coupled to voltage $Vb_1$. The drain portion of the current interface of each input transistor 310, 320 is coupled to the source portion of the current interface of each telescopic cascode transistor 312, 322 respectively. The control interfaces of the telescopic cascode transistor 312, 322 of each current source are coupled to voltage $Vb_2$. The drain portion of the current interface of the telescopic cascode transistors 312 and 322 of each current source are coupled at the drain portion of the corresponding current interfaces to the telescopic cascode transistors 222, 242 respectively.

In operation the bypass capacitors 314, 324 of the current source are sized such that the input currents flows generated by the input transistors flow through the telescopic cascode transistors 312, 322 at frequencies below the pole frequency of the corresponding telescopic cascode transistor. At these low frequencies, the current source bypass capacitors 314, 324 have no effect, thereby preserving cascode gain. However the current source bypass capacitors are sized to bypass the corresponding telescopic cascode transistor at frequencies approaching the corresponding transition frequency for the telescopic cascode transistors of the current source. This second high frequency bypass is represented by the bypass current paths 350 also shown in dotted line. Thus the beneficial effects of the telescopic cascode current source at low frequencies, i.e. increased current source impedance and corresponding enhanced gain are retained and the detrimental effects of the telescopic cascode current source at high frequencies, i.e. an added non-dominant pole are overcome by allowing the current source at these frequencies to perform as a single transistor current source.

Figure 3:
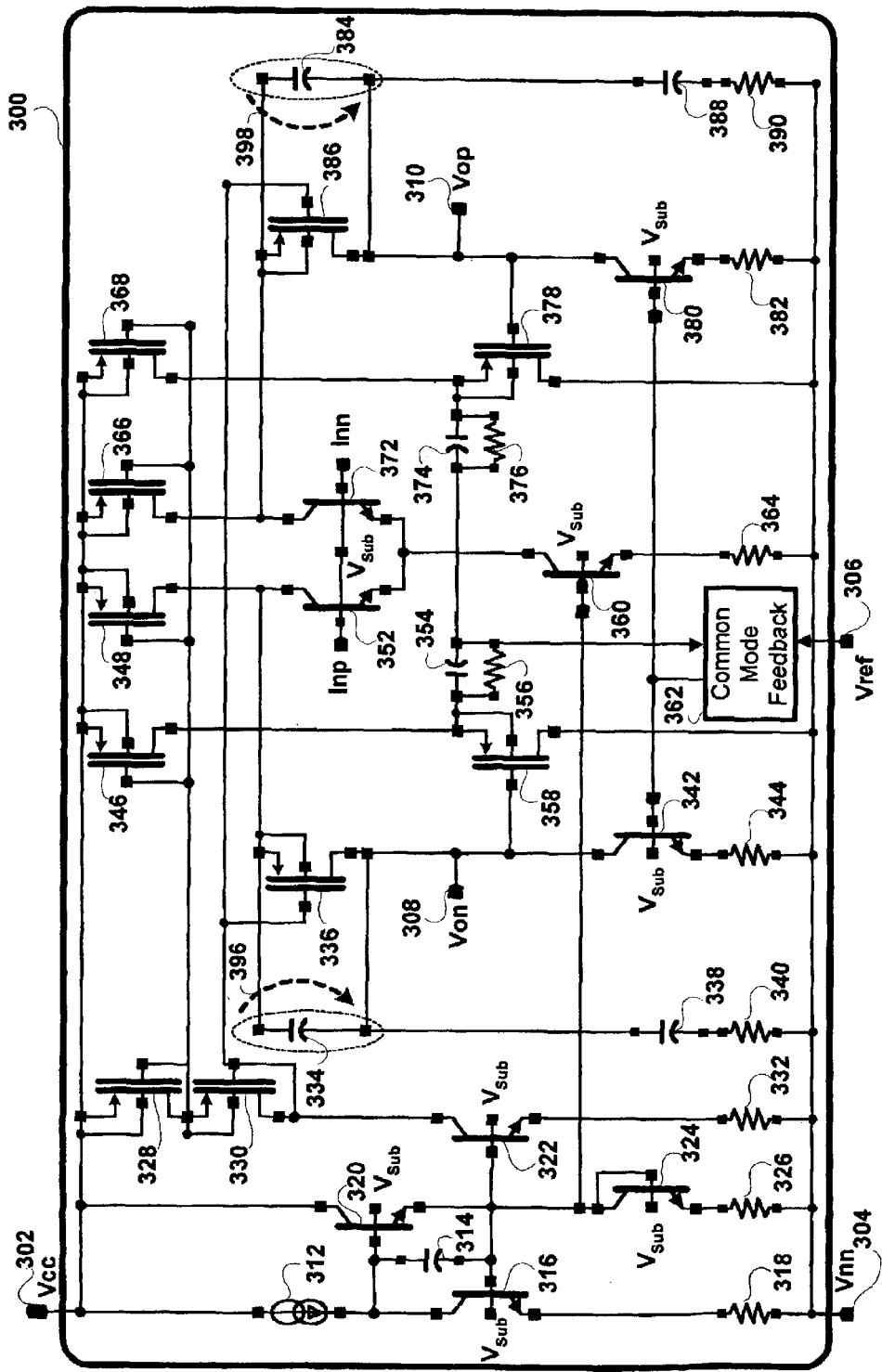
FIG. 3 is a circuit diagram of a folded cascode type differential amplifier stage with compensation according to an embodiment of the invention.

FIG. 3 is a circuit diagram of a folded cascode type differential amplifier stage 300 with compensation according to an embodiment of the invention. This embodiment is particularly suited for a high frequency multi-stage amplifier and might serve as the first stage of same. The process technology is BiCMOS, although the circuit may be implemented with alternate process technologies as well. The circuit includes two pairs of folded cascode coupled transistors 352, 336 and 372, 386 with the input transistors 352, 372 of each pair coupled to corresponding ones of the differential input signals $In_p$ and $In_n$. The differential input signals $In_p$ and $In_n$ applied to the control interfaces of input transistors 128, 148 are converted into differential currents. The emitter portion of the current interface of both input transistors couple in parallel to a common current sink formed by series coupled transistor 360 and resistor 364 which is in turn coupled to voltage Vnn at pad 304. The drain portion of the current interface of each folded cascode transistor 336, 386 couples to a corresponding one of current sinks formed by series coupled transistor resistor combinations 342–344 and 380–382, the resistor portions of each of which are in turn coupled to the voltage Vnn at pad 304. The control interfaces of transistors 342, 380 are coupled to one another and controlled from the Common Mode Feedback Control (CMFB) circuit. The differential outputs are provided at pads 308, 310 which tap the corresponding connection between each folded cascode transistor 336, 386 and the corresponding current sink. The control interfaces of the folded cascode transistors 336, 386 are coupled to a bias generated by transistors 328, 330 coupled between an electrical source Vcc at pad 302 and the series coupled transistor resistor combination 322, 332 the resistor of which is coupled to Vnn at pad 304. A bias circuit coupled to the control interface of transistor 322 is shown comprising two source sink coupled series legs a first of which is formed by current source 312, transistor 316 and resistor 318, a second of which is formed by transistors 320, 324 and resistor 326. The control interfaces of transistors 316 and 320 are capacitatively coupled to one another by capacitor 314. The control interface of transistor 322 couples to capacitor 314 and to the control interface of transistor 316. The source/body portion of the current interface of each transistor in the two pairs of cascode coupled transistors, couples to a corresponding one of current sources provided by transistors 348, 366 which are in turn coupled to the voltage Vcc at pad 302. Bypass compensation capacitors 334 and 384 are coupled across the current interfaces, e.g. drain-source connection on the corresponding folded cascode transistors 336, 386 respectively. Each bypass capacitor is in turn series coupled to Vnn by a corresponding one of series coupled capacitor-resistor combinations 338–340 and 388–390. A common mode feedback block (CMFB) 362 has a reference input coupled to Vref at pad 306; an input coupled between the parallel coupled RC combinations 354–356 and 374–376, and an output coupled to the control interfaces of transistors 342, 380. These RC combinations couple to the outputs of the source follower configured transistors 358, 378 which have current sources 346, 368 respectively.

The input and cascode transistors of each pair are of complementary conductivity types, i.e. "n" type and "p" type with the higher speed of the two types, i.e. the "n" type selected for the input transistor. Additionally, where as here, the process technology is BiCMOS the input transistor is implemented with the higher speed transistor type, i.e. BJT while the cascode transistor is implemented with a lower speed transistor type, e.g. FET. The choice of the higher speed conductivity and/or transistor type for the input transistor maximizes the operational frequency range of the amplifier. At frequencies above the pole frequency for the corresponding ones of folded cascode transistors 336, 386 the differential current bypasses the folded cascode transistors through the corresponding one of capacitors 334, 384 respectively as indicated by dotted line arrows 396 and 398.

Figure 4:
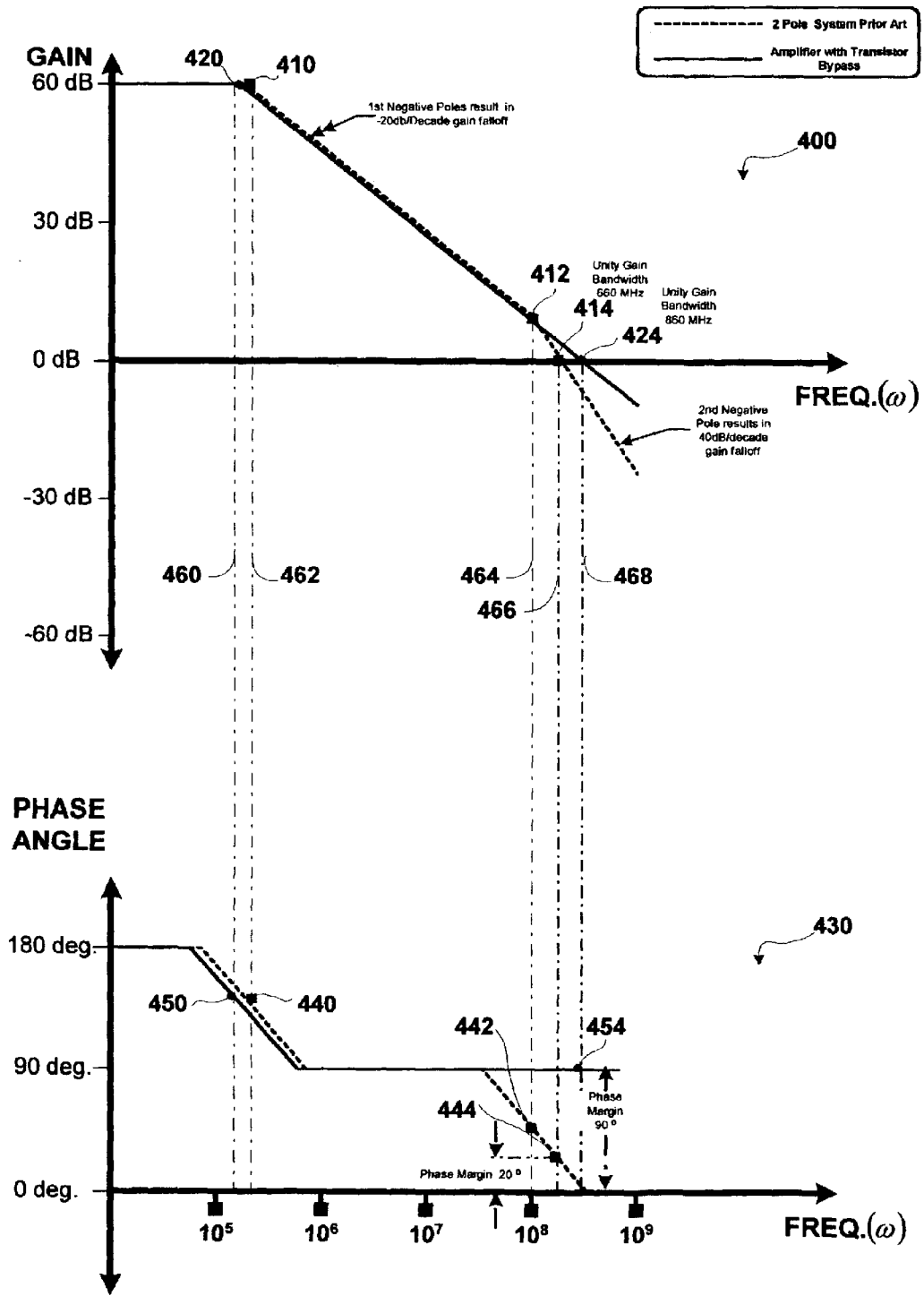
FIG. 4 is a graph with Bode plots of both gain and phase angle vs. frequency for the embodiment of the folded cascode amplifier shown in FIG. 1A.

FIG. 4 is a graph with Bode plots of both gain and phase angle vs. frequency for the embodiment of the folded cascode differential amplifier shown in FIG. 1A. The gain plot 400 shows two plots: one (dashed line) for the amplifier shown in FIG. 1A without the bypass compensation capacitors 124, 144 and the other (solid line) for the amplifier with bypass compensation.

The Bode gain plot for the uncompensated folded cascode differential amplifier (dashed line) shows two poles, i.e. a dominant pole 410 and a non-dominant pole 412. The dominant pole 410 at a pole frequency 462 is associated with the parasitic load capacitances 182, 192 at the amplifier outputs 106, 110. The non-dominant pole 412 at a pole frequency 464 is associated both with the parasitic capacitances 180, 190 together with the inverse of transconductance of the cascode transistors 122, 142 respectively. The phase angle graph 430 shows that at DC, i.e. f=0, the folded cascode amplifier has a phase angle of 180 degrees (dashed line), indicating perfect negative feedback and corresponding linearity of performance. Over a frequency range spanning a decade centered on the first pole frequency 462 the phase angle decreases to 90° as a result of the first pole 410. Next, over a frequency range spanning a decade centered on the second pole frequency 464 the phase angle decreases to 0° as a result of the second pole 412. The stability of the uncompensated folded cascode decreases proportionally with the phase angle. Figures of merit for the amplifier are: the unity gain bandwidth (UGBW), and the phase margin at 0 dB gain. Higher UGBW and phase margins are desirable. For the uncompensated folded cascode differential amplifier the UGBW spans the frequency range from DC, i.e. f=0, to the upper frequency 466 at which gain is zero. The phase margin 444 is approximately 20° at zero gain.

The folded cascode differential amplifier with compensation (solid line) differs significantly from the uncompensated circuit both in terms of UGBW and phase margin. The Bode gain plot for the bypass compensated folded cascode differential amplifier (solid line) shows only one pole, i.e. the dominant pole 420. The bypass capacitors 124, 144 on the current interface portion of the cascode transistors eliminate the non-dominant pole with a zero created at frequency proximate to the non-dominant pole frequency. The dominant pole 420 at a pole frequency 460 is associated with the parasitic load capacitances at the amplifier outputs 182, 192. The phase angle graph 430 shows that at DC, i.e. f=0, the bypass compensated folded cascode amplifier has a phase angle of 180 degrees (solid line), indicating perfect negative feedback and corresponding linearity of performance. Over a frequency range spanning a decade centered on the first pole frequency 460 the phase angle decreases to 90° as a result of the first pole 420. Further frequency increases result in no significant change of phase angle, which remains at 90° and thus no further degradation in the stability of the amplifier. For the bypass compensated folded cascode differential amplifier the UGBW spans a broader frequency range than the uncompensated circuit, from DC, to the upper frequency 468 at which gain is zero. The phase margin 454 is approximately 90° at zero gain. As is evident in the Bode gain and phase plots shown in FIG. 4 the introduction of an electrical bypass clement, e.g. a capacitor, which bypasses the cascode transistor at frequencies at which a pole would otherwise be introduced by same, allows both improved UGBW and phase margin as compared with the uncompensated circuit.

TABLE 1

Amplifier performance with and without bypass compensation:

| | Un-Compensated | Bypass Compensation |
| --- | --- | --- |
| UGBW (output) | 660 MHz | 860 MHz |
| Phase margin | 20 | 90 |

The bypass capacitances required to achieve the results shown in Table 1 are on the order of 2 pf or less. Thus bypass current consumption is kept at a minimum. This allows usage of lower bias currents in the amplifier stage for a given harmonic distortion with corresponding lower power requirements.

FIG. 5 is a circuit diagram of a gain boosted folded cascode type differential amplifier stage with compensation according to an embodiment of the invention. The circuit is implemented in this example with bipolar complementary metal oxide semiconductor (BiCMOS) process technology. The circuit includes a pair of folded cascode coupled transistors 532, 562 with the input transistors 540, 568 coupled to the differential input signals $In_p$ and $In_n$. Transistors 520, 570 form gain boosting stages and drive the gates of folded cascode transistors 532, 562 respectively. The differential input signals $In_p$ and $In_n$ applied to the control interfaces of input transistors 540, 568 are converted into differential currents. The emitter portion of the current interfaces of both input transistors couple in parallel to a common current sink 550 which is in turn coupled to voltage Vnn at pad 504. The drain portion of the current interfaces of each cascode transistor 532, 562 couples to a corresponding one of current sinks 536, 566 respectively which are in turn coupled to the voltage Vnn at pad 504. The differential outputs are provided at pads 506, 510 which tap the corresponding connection between each cascode transistor 532, 562 and the corresponding current sink 536, 566 respectively. The control interfaces of the cascode transistors, i.e. the gates of FETs 532, 562 are coupled to the drain portion of the control interfaces of gain boosting FETs 520, 570 respectively. The drain portion of the control interfaces of the gain boosting FETS 520, 570 couples to Vnn at pad 504 via a corresponding one of current sinks 524, 574 respectively. The control interfaces of the gain boosting FETS 532, 562 are coupled to the source portion of the current interfaces of the corresponding cascode FETs 534, 562 respectively. The source portion of the control interfaces of the gain boosting FETs 520, 570 couple to Vcc at pad 502. The source/body portion of the current interface of each cascode transistor 532, 562 couples to a corresponding one of current sources 530, 560 respectively which are in turn coupled to the voltage Vcc at pad 502. Bypass compensation capacitors 534 and 564 are coupled across the current interfaces, e.g. drain-source connection, on the corresponding cascode transistor 532, 562 respectively. The gain boosted transistors are also bypass compensated by capacitors 522 and 572 which are coupled across the current interfaces, e.g. drain-source connection, on the corresponding one of gain boosted transistors 520, 570 respectively.

In operation the cascode bypass capacitors 534, 564 are sized such that the differential currents flows generated by the input transistors flow through the folded cascode transistors at frequencies below the pole frequency of the corresponding cascode transistor. At these low frequencies, the bypass capacitors have no effect, thereby preserving cascode gain. However the capacitors are sized to bypass the corresponding folded cascode transistor introducing a zero proximate the pole due to the folded cascode transistor comes into effect. The high frequency bypass is represented by the bypass current paths 580, 590 shown in dotted line. In operation the gain boosted transistor bypass capacitors 522, 572 are sized such that the currents flows through the current interfaces of the gain boosted transistors at frequencies below the pole frequency of the corresponding gain boosted transistor. The gain boosted transistor bypass capacitors are sized to bypass the corresponding transistor at frequencies above the corresponding pole frequencies of the gain boosted transistors. These bypass capacitors also introduce a zero proximate the pole due to the gain boosted transistors comes into effect. The high frequency bypass is represented by the second set of bypass current paths 582, 592 shown in dotted line. In still another embodiment of the invention further improvements in UGBW and phase margin of this amplifier can be realized by a capacitor or a resistor-capacitor in series coupled between the outputs 506, 510 and Vnn at pad 504.

In alternate embodiments of the invention the cascode compensation disclosed above in connection with BiCMOS process technology can be applied with equal advantage on integrated circuits fabricated with alternate process technologies such as: bipolar and CMOS. In still other embodiments of the invention the cascode compensating can be applied with equal advantage to amplifiers fabricated from discrete components.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An amplifier for amplifying an input signal, and the amplifier comprising:
    a current source;
    a current sink; and
    at least one compensated pair of cascode coupled transistors coupled between the current source and current sink and including:
        an input transistor having a current interface and a control interface coupled to the input signal to regulate current flow between the current sink and current source, and the input transistor exhibiting a first transition frequency;
        a cascode transistor having a current interface cascode coupled to the current interface of the input transistor and exhibiting a second transition frequency less than or equal to the first transition frequency of the input transistor, and
        a bypass element coupled across the current interface of the cascode transistor to substantially bypass the cascode transistor proximate a pole frequency thereof, whereby current flows between the current source and sink via both the input transistor together with the cascode transistor across a low frequency portion of the range of frequencies below a pole frequency of the cascode transistor and via the input transistor and the bypass element across a high frequency portion of the range of frequencies above the pole frequency of the cascode transistor.

2. The amplifier of claim 1, wherein the at least one compensated pair further comprises:
    a first and a second compensated pair of cascode coupled transistors having corresponding input transistors coupled to corresponding differential input signals for differential amplification of same.

3. The amplifier of claim 1, further comprising:
    a second compensated pair of cascode coupled transistors coupled in a telescopic cascode configuration between a voltage source and the first compensated pair to supply current thereto.

4. The amplifier of claim 1, wherein the bypass element comprises:
    at least one capacitor.

5. The amplifier of claim 1, wherein the cascode coupling comprises one of a telescopic cascode coupling and a folded cascode coupling.

6. The amplifier of claim 1, wherein the input transistor comprises a bipolar junction transistor (BJT) and the cascode transistor comprises a field effect transistor (FET).

7. The amplifier of claim 1, wherein the input transistor comprises a bipolar junction transistor (BJT) of an "n" conductivity type and the cascode transistor comprises a field effect transistor (FET).

8. The amplifier of claim 1, wherein the bypass element creates a zero that corresponds with the pole effected by the cascode transistor.

9. An amplifier comprising:
    at least one compensated pair of cascode coupled transistors including:
        an input transistor exhibiting a first transition frequency;
        a cascode transistor cascode coupled to the input transistor and exhibiting a second transition frequency less than or equal to the first transition frequency of the input transistor;
        a bypass element coupled across a corresponding current interface of the cascode transistor to substantially bypass the cascode transistor proximate a pole frequency thereof;
        a gain boosting amplifier including the control interface thereof; and
        a gain bypass element coupled across a corresponding current interface of the gain boosting amplifier to substantially bypass the gain boosting transistor proximate a pole frequency thereof.

10. The amplifier of claim 9, wherein the gain boosting amplifier further comprises:
    a single transistor.

11. A method for amplifying input signals having frequencies spanning a range of frequencies; and the method comprising:
    cascode coupling between at least one current source and sink, at least one input transistor exhibiting a first transition frequency and at least one cascode transistor exhibiting a second transition frequency less than or equal to the first transition frequency;
    coupling a control interface of the at least one input transistor to the input signals to regulate current flow between the at least one current source and sink; and
    passing current between the at least one current source and sink via both the input transistor together with the cascode transistor across a low frequency portion of the range of frequencies below a pole frequency associated the at least one cascode transistor and via the input transistor and a bypass of the at least one cascode transistor across a high frequency portion of the range of frequencies above the pole frequency of the at least one cascode transistor.

12. The method of claim 11, wherein the passing act further comprises:
    capacitatively bypassing the at least one cascode transistor across the high frequency portion of the range of frequencies.

13. The method of claim 11, wherein the cascode coupling act further comprises:
    cascode coupling the at least one input transistor and the at least one cascode transistor in one of: a folded cascode configuration, a telescopic cascode configuration and a gain boosted cascode configuration.

14. The method of claim 11, wherein the cascode coupling and coupling acts further comprise:
    cascode coupling between the at least one current source and sink differential input transistors exhibiting the first transition frequencies and to corresponding cascode transistors exhibiting the second transition frequencies; and coupling corresponding control interfaces of the differential input transistors to corresponding differential ones of the input signals to regulate current flow between the electrical source and sink.

15. The method of claim 11, wherein the cascode coupling act further comprises:
providing the at least one current source with a pair of transistors telescopic cascode coupled to one another and a bypass element coupled across a corresponding current interface of a cascode one of the pair of transistors to pass current substantially exclusively via the bypass element across the high frequency portion of the range of frequencies.

16. The method of claim 11, wherein the at least one input transistor comprises a bipolar junction transistor (BJT) and the at least one cascode transistor comprises a field effect transistor (FET).

17. A means for amplifying input signals having frequencies spanning a range of frequencies; and the means for amplifying comprising:
means for cascode coupling between at least one current source and sink, at least one input transistor exhibiting a first transition frequency and at least one cascode transistor exhibiting a second transition frequency less than or equal to the first transition frequency;
means for coupling a control interface of the at least one input transistor to the input signals to regulate current flow between the at least one current source and sink; and
means for passing current between the at least one current source and sink via both the input transistor together with the cascode transistor across a low frequency portion of the range of frequencies below a pole frequency associated the at least one cascode transistor and via the input transistor and a bypass of the at least one cascode transistor across a high frequency portion of the range of frequencies above the pole frequency of the at least one cascode transistor.

18. The means for amplifying of claim 17, wherein the bypass element of the means for passing further comprises:
means for capacitatively bypassing the at least one cascode transistor across the high frequency portion of the range of frequencies.

19. The means for amplifying of claim 17, wherein the means for cascode coupling further comprises:
means for cascode coupling the at least one input transistor and the at least one cascode transistor in one of: a folded cascode configuration and a telescopic cascode configuration.

20. The means for amplifying of claim 17, wherein the means for cascode coupling and the means for coupling further comprise:
means for cascode coupling between the at least one current source and sink differential input transistors exhibiting the first transition frequencies and to corresponding cascode transistors exhibiting the second transition frequencies; and
means for coupling corresponding control interfaces of the differential input transistors to corresponding differential ones of the input signals to regulate current flow between the electrical source and sink.

21. The means for amplifying of claim 17, wherein the means for cascode coupling further comprises:
means for providing the at least one current source with a pair of transistors telescopic cascode coupled to one another and a bypass element coupled across a corresponding current interface of a cascode one of the pair of transistors to pass current substantially exclusively via the bypass element across the high frequency portion of the range of frequencies.

22. The means for amplifying of claim 17, wherein the at least one input transistor comprises a bipolar junction transistor (BJT) and the at least one cascode transistor comprises a field effect transistor (FET).

* * * * *